United States Patent

Nagata et al.

[11] Patent Number: 5,814,844
[45] Date of Patent: Sep. 29, 1998

[54] GATE ARRAY HAVING HIGHLY FLEXIBLE INTERCONNECTION STRUCTURE

[75] Inventors: Takashi Nagata, Oobu; Hiroshi Uesugi, Nagoya; Hiroaki Tanaka, Okazaki, all of Japan

[73] Assignee: Nippondenso Co., Ltd., Kariya, Japan

[21] Appl. No.: 721,448

[22] Filed: Sep. 27, 1996

[30] Foreign Application Priority Data

Sep. 28, 1995 [JP] Japan ................................... 7-251611

[51] Int. Cl.⁶ .................................................. H01L 27/10
[52] U.S. Cl. ........................ 257/206; 257/207; 257/211; 257/204; 257/773
[58] Field of Search ................................. 257/206, 211, 257/204, 207, 208, 365, 366, 773

[56] References Cited

U.S. PATENT DOCUMENTS

| | | | |
|---|---|---|---|
| 4,692,783 | 9/1987 | Monma et al. | 357/42 |
| 4,737,836 | 4/1988 | Askin et al. | 357/45 |
| 5,083,178 | 1/1992 | Otsu . | |
| 5,384,472 | 1/1995 | Yin | 257/204 |
| 5,612,553 | 3/1997 | Arakawa | 257/206 |
| 5,652,441 | 7/1997 | Hashimoto et al. | 257/206 |

FOREIGN PATENT DOCUMENTS

| | | |
|---|---|---|
| 2-58380 | 2/1990 | Japan . |
| 3-141670 | 6/1991 | Japan . |
| 5-62469 | 9/1993 | Japan . |
| 5-259415 | 10/1993 | Japan . |
| 6-13589 | 1/1994 | Japan . |

*Primary Examiner*—Olik Chaudhuri
*Assistant Examiner*—Douglas A. Wille
*Attorney, Agent, or Firm*—Cushman Darby & Cushman IP Group of Pillsbury Madison & Sutro LLP

[57] ABSTRACT

A basic cell structure of a gate array that allows wiring in a macro cell is implemented solely by using first layer metallic wires and entails neither performance deterioration nor an increase in sell size. The basic cell of the gate array comprises a pMOS transistor having two FETs connected in series to each other and an nMOS transistor also having two FETs also connected in series to each other. The pMOS transistor and the nMOS transistor are formed on a substrate and arranged in parallel to each other, and gate electrodes corresponding to the FETs are commonly provided for the pMOS transistor and the nMOS transistor. In this structure, a first auxiliary wire is provided between the gate electrodes on the same layer as the gate electrodes. A second auxiliary wire is provided between adjacent basic cells also on the same layer as the gate electrodes. Wiring in a macro cell can be completed by using the first and second auxiliary wires of different types to form a two-dimensional structure. That is, wiring can be completed solely by using the first layer metallic wires.

20 Claims, 7 Drawing Sheets

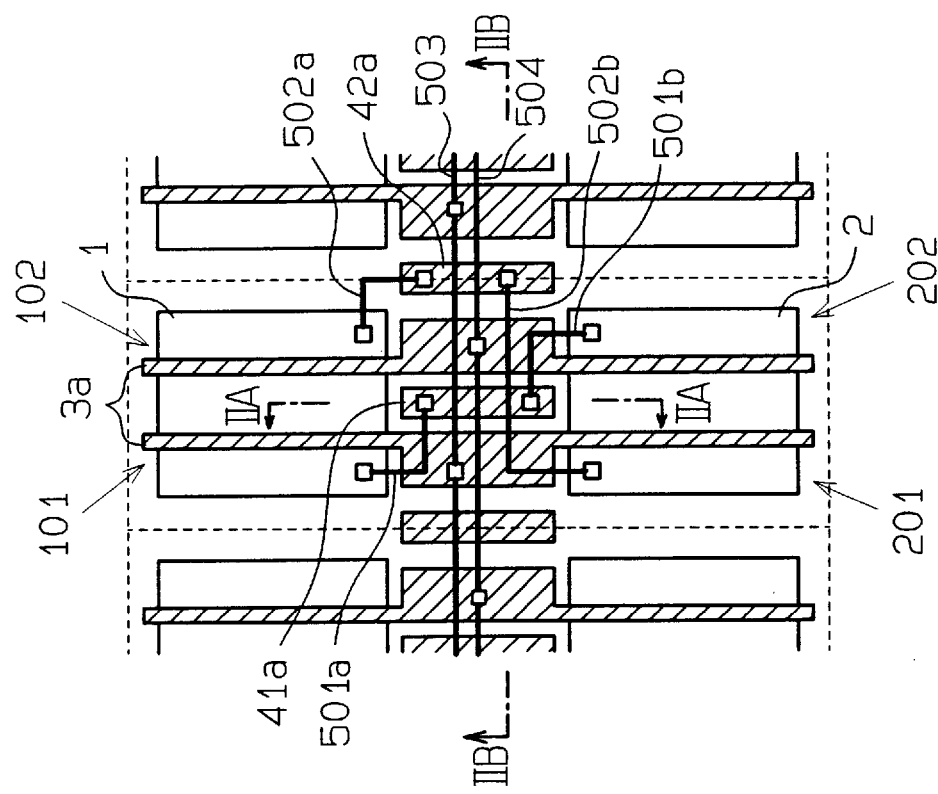
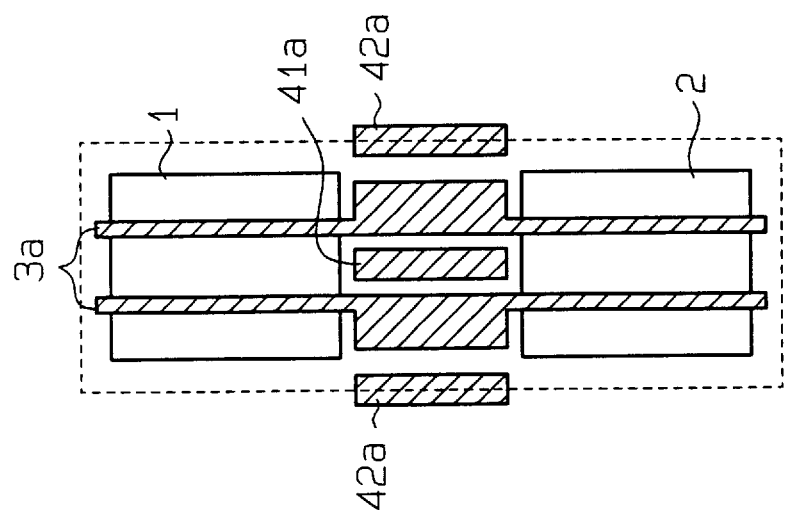

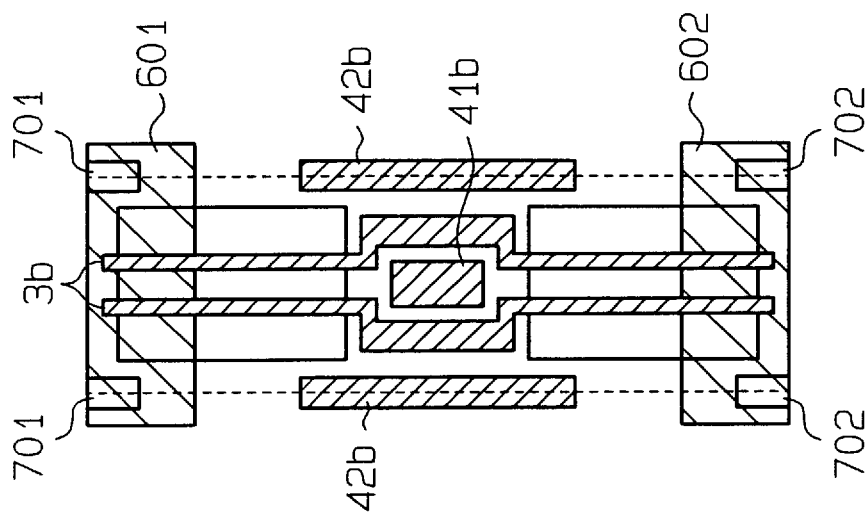
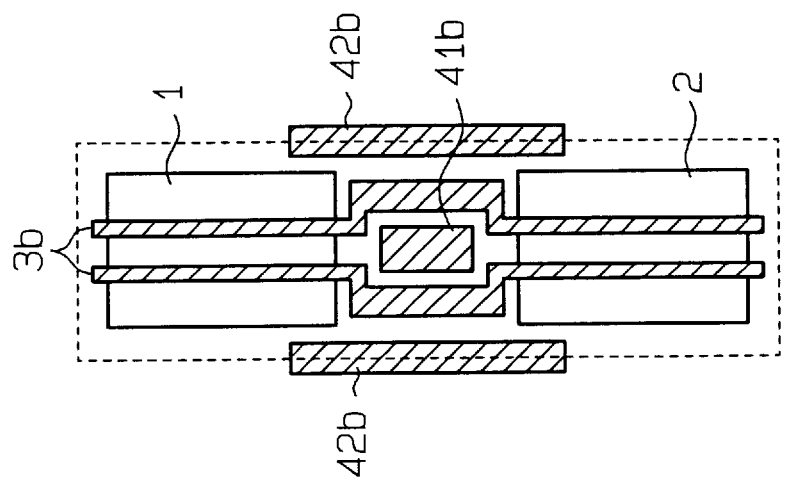

GATE ARRAY HAVING HIGHLY FLEXIBLE INTERCONNECTION STRUCTURE

CROSS-REFERENCE TO RELATED APPLICATION

The present application is related to and claims priority from Japanese Patent Application No. Hei 7-251611, filed Sep. 28, 1995, incorporated herein by reference.

BACKGROUND OF THE INVENTION

1. Field of the Invention

The present invention relates in general to gate arrays and in particular to an improved structure of basic cells forming a gate array for enhancing the routability thereof without increasing the size of each basic cell.

2. Description of Related Art

As is generally known, a gate array is an array of cells (or basic cells) which are regularly arranged in advance in a large-scale integrated circuit (hereinafter "LSI") independently of the product design of the chip of the LSI. During the product design, only the wiring is designed. Thus, a gate array is a semi-custom semiconductor integrated circuit device that allows functional circuits adapted to a variety of demands to be implemented. Accordingly, for such a gate array, a basic cell structure that allows routability to be increased and the design of the wiring process to be implemented with a high degree of flexibility and with ease during the product design is an important factor for enhancing the quality or the added value of the product.

Some conventionally proposed basic cell structures wherein auxiliary wiring is implemented on the same layer as gate electrodes of each transistor forming the basic cell to improve the routability of the gate array will be described below.

According to a first example disclosed in Japanese Laid-Open Patent Publication No. Hei 3-141670 and shown in FIG. 9, for instance, gate electrodes 31 and 32 of a p-channel MOS transistor (hereinafter "a pMOS 1") and gate electrodes 34 and 33 of an n-channel MOS transistor (hereinafter "an nMOS 2") are arranged point-symmetrically with regard to the center. At the center of the split gate electrodes 31, 32, 33 and 34, an auxiliary wire 8 is provided. It becomes easier to implement parallel or crossed connection of the gate electrodes 31, 32, 33 and 34 by employing such a connection.

According to a second example described in Japanese Patent Publication No. Hei 6-13589 and shown in FIG. 11, gate electrodes 35 common to a pMOS 1 and an nMOS 2 are provided and auxiliary wires 9 are disposed between basic cells comprised in a gate array. Such auxiliary wires 9 employed both in each cell and between the cells allow the scale of integration to be increased. It should be noted that, according to the second example of the basic cell structure of a gate array as shown in FIG. 11, a bias region provided between basic cells is denoted by reference numeral 10.

It is obvious from the examples described above that, in general, the routability and the scale of integration can be increased by implementing auxiliary wiring both in each cell and between the cells. When an attempt is made to further increase the routability in such a gate array, however, it is desirable to implement the basic cell structure as described above with the following requirements satisfied:

(A) Only a first-layer metallic wire is used inside a macro cell and the use of another metallic wire therein should be avoided whenever possible.

(B) A metallic wire other than the first-layer metallic wire can be used with a high degree of freedom between macro cells.

Such a basic cell structure is particularly beneficial to a gate array having a two-layer metallic wire structure which has been adopted in a number of contemporary gate arrays.

When seen from such a point of view, however, it would not be safe to assume that the basic cell structures adopted in the conventional gate arrays satisfy the requirements (A) and (B) described above.

When an attempt is made to implement wiring using the arrangement shown in FIG. 9 to implement a circuit shown in FIG. 13, it is necessary to provide a first-layer metallic wire 513 for connecting the gate electrodes 31 and 33 with each other and another first-layer metallic wire 514 for connecting the gate electrodes 32 and 34 with each other as shown in FIG. 10.

If the implementation of cross wiring is required, the gate electrode 31 is connected to the gate electrode 34 by the auxiliary wire 8 while the gate electrode 32 is directly connected to the gate electrode 33. A gate-array circuit of this type, however, necessitates metallic wires provided between the gate electrodes of a plurality of basic cells and used for applying gate voltages therebetween to control the gate electrodes of the basic cells formed on a substrate simultaneously. Furthermore, a number of basic cells having a plurality of wiring patterns are formed on the substrate. When it is necessary to implement both cross wiring and non-cross wiring (a wiring pattern as shown in FIG. 10) on a single substrate for the gate arrays as shown in FIGS. 9 and 10, the arrangement of metallic wires connecting the gate electrodes becomes complex.

Also, when an attempt is made to implement wiring using the arrangement shown in FIG. 11 to implement a circuit as shown in FIG. 13, it is necessary to form a two-layer wiring structure as shown in FIG. 12 including first layer metallic wires (shown with a solid line) and a second layer metallic wire (shown with a broken line) typically used for connecting sources or drains made of the pMOS 1 and the nMOS 2.

As a result, the basic cell structure of the second example cannot satisfy either of the requirements (A) or (B).

It should be noted that a white square in FIG. 12 represents a contact hole for connecting a diffusion layer of the PMOS 1, the nMOS 2 and the like, or a polysilicon region forming a gate electrode or an auxiliary wire to a first layer metallic wire. On the other hand, a hatched square represents a contact hole for connecting a first layer metallic wire to a second layer metallic wire. Power supply wires are denoted by reference numerals 601 and 602.

SUMMARY OF THE INVENTION

It is thus an object of the present invention to provide a gate array having a basic cell structure that allows wiring in a macro cell to be implemented solely with first layer metallic wires without deteriorating device performance or increasing the cell size.

In order to achieve the object described above, according to the present invention, each basic cell of the gate array is provided with two types of auxiliary wires that complete the wiring in each macro cell in a two-dimensional structure. That is, a first auxiliary wire provided between gate electrodes and a second auxiliary wire provided between basic cells are for each pair of first and second element regions, arranged adjacent to each other with a gate electrode interposed therebetween.

Therefore, wiring including leads electrically isolated from each other can be implemented in a two-dimensional structure wherein only the first layer metallic wires are employed by using the auxiliary wires regardless of whether the first and second element regions are connected crossingly or in parallel.

In this way, wiring in a macro cell can be implemented solely by using first layer metallic wires while a metallic wire other than the first layer metallic wires can be used with a high degree of freedom between macro cells. As a result, the routability is significantly increased. Further, when power supply wires for supplying power to each basic cell are arranged perpendicularly to the gate electrodes thereof, a possible wiring range between the second auxiliary wire and the first and second element regions is enlarged by setting the length of the second auxiliary wire, which further enhances the routability. In this case, since the length of the second auxiliary wire is limited so that the second auxiliary wire does not come into contact with the power supply wires, a conventionally unavoidable increase in the parasitic capacitance and the size of the cell due to the use of the second auxiliary wire can be effectively prevented.

Also, when a bias region is provided in a certain portion of each basic cell where an extension of the second auxiliary wire would cross the power supply wire, the effective size of the cell is determined with the bias region included. In this case, there is substantially no increase in cell size due to the use of the second auxiliary wire. Even if the area of the bias region itself is small, a reliable supply of power is ensured from the power supply wires. That is to say, the structure of the basic cell is also effective in reducing the increase in cell size to a minimum.

On the other hand, it is also possible to adopt a basic cell structure wherein the gate electrodes are close to each other in the first and second element regions but spaced apart from each other in the intermediate portion between the first and second element regions, and the first auxiliary wire is provided in the intermediate portion spacing both gate electrodes apart from each other, that is, the portion between the first and second element regions.

With such a basic cell structure, a conventionally unavoidable increase in the cell size due to the use of the first auxiliary wire can be effectively prevented and, at the same time, the performance of the element or the device hardly deteriorates due to the parasitic-resistance component and the capacitance of the transistors included in the first and second element regions.

Preferably, at least two auxiliary wires are provided in each basic cell in an intermediate region between a first element region (1) and a second element region (2), thereby facilitating wiring in the basic cell and wiring between basic cells.

Using advantageous aspects of the present invention, it becomes easy to implement the so-called cross wiring wherein a portion on a first element region (1) outside a first gate electrode is connected to a portion on a second element region (2) outside a second gate electrode and a portion on the first element region (1) outside the second gate electrode is connected to a portion on the second element region (2) outside the first gate electrode, or wiring wherein a portion on the first element region (1) outside the first gate electrode is connected to a portion on the second element region (2) outside the first gate electrode and a portion on the first element region (1) outside the second gate electrode is connected to a portion on the second element region (2) outside a second gate electrode.

Further, it becomes easy to implement cross wiring wherein a portion on the first element region (1) outside the first gate electrode is connected to a portion on the second element region (2) outside the second gate electrode and a portion on the first element region (1) outside the second gate electrode is connected to a portion on the second element region (2) outside the first gate electrode.

Moreover, it is possible to provide a layer of power supply wires on a section covering the basic cells regardless of the wiring patterns of the first to fourth connecting layers.

Preferably, the first to fourth connecting layers are implemented as a single layer, thereby allowing the number of fabrication processes to be reduced. Further, the first to fourth connecting layers and the layer for the power supply wires are implemented as a single layer, thereby allowing the number of fabrication processes to be reduced.

Also preferably, the two auxiliary wires allow the first to fourth connecting layers and the layer for the power supply wires to be implemented on a single plane, which avoids the development of a multi-layer wiring structure and facilitates the implementation of wiring in each basic cell and wiring between basic cells.

Preferably, the first and second gate electrodes and the auxiliary wire layer are made of the same material and have the same thickness, thereby allowing the number of fabrication processes to be reduced.

Other objects and features of the invention will appear in the course of the description thereof, which follows.

BRIEF DESCRIPTION OF THE DRAWINGS

Additional objects and advantages of the present invention will be more readily apparent from the following detailed description of preferred embodiments thereof when taken together with the accompanying drawings in which:

FIG. 1 is a plane diagram showing a first embodiment of a gate array according to the present invention;

FIG. 2A is a plane diagram showing an example of typical wiring in a macro cell according to the first embodiment.

FIG. 7 is a plane diagram showing a fourth embodiment of a gate array according to the present invention;

FIG. 8 is a plane diagram showing a fifth embodiment of a gate array according to the present invention;

DETAILED DESCRIPTION OF THE PRESENTLY PREFERRED EXEMPLARY EMBODIMENTS

FIG. 1 is a diagram showing a gate array according to a first embodiment of the present invention.

A plane structure of each basic cell in a gate array according to the first embodiment is schematically shown in FIG. 1. In practice, thus-constructed basic cells are arranged on a substrate to form a one-dimensional array or a two-dimensional matrix.

First of all, the structure of the basic cell in a gate array according to the first embodiment will be explained with reference to FIG. 1.

Each basic cell of the gate array according to the first embodiment, as shown in the Figure, includes a PMOS 1 and an nMOS 2 arranged in parallel on a semiconductor substrate (not shown). The pMOS 1 and the nMOS 2 respectively include two transistors (FETS) connected in series. Gate electrodes 3$a$ common to the pMOS 1 and the nMOS 2 are formed connected thereto. A first auxiliary wire 41$a$ is provided on the same layer as the gate electrodes 3$a$ between the gate electrodes 3$a$ as shown in FIG. 1, and second auxiliary wire 42$a$ is provided also on the same layer as the gate electrodes 3$a$ between two adjacent basic cells. The regions of the PMOS 1 and the nMOS 2 are diffusion layers of p-type and n-type impurities respectively while the gate electrodes 3$a$, the first auxiliary wire 41$a$ and the second auxiliary wire gates 42$a$ are made of polysilicon.

The basic cell structure in the gate array of the first embodiment satisfies the following requirements (A) and (B):

(A) Only a first-layer metallic wire is used inside a macro cell and the use of another metallic wire therein should be avoided whenever possible.

(B) A metallic wire other than the first-layer metallic wire can be used with a high degree of freedom between macro cells.

Figure 2B:
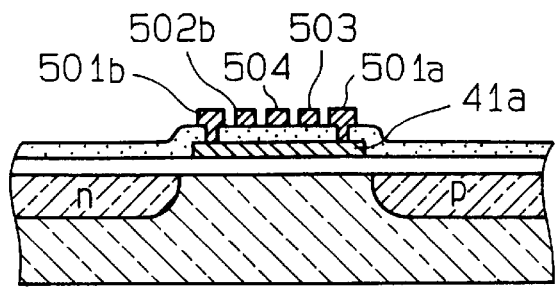
FIGS. 2B and 2C are diagrams showing side views of the wiring.
Figure 13:
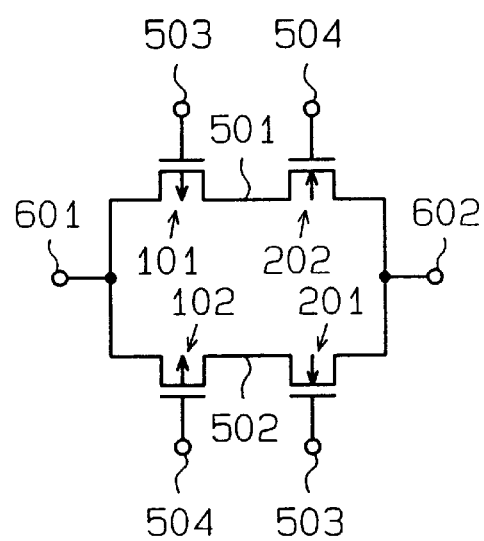
FIG. 13 is schematic diagram showing an equivalent circuit of the first example of the wiring in the macro cell.

FIG. 2A is a diagram showing an example of typical wiring for implementing the circuit as shown in FIG. 13 by using the gate array according to the first embodiment. FIG. 2B shows a cross section taken along a IIB—IIB line as shown in FIG. 2A.

Figure 2C:
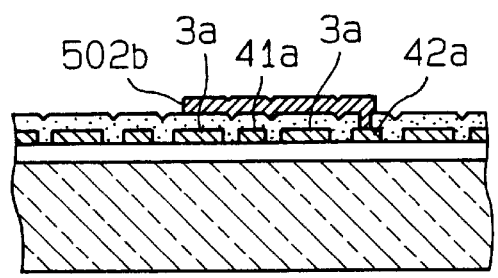

FIG. 2C shows a cross section taken along a IIC—IIC line as shown in FIG. 2A. The wiring of the gate array according to the first embodiment will be further explained below with reference to FIGS. 2A–2C.

According to the first embodiment, one end of a first auxiliary wire 41$a$ is connected to a transistor 101 by a metallic wire 501$a$ (a first wire). On the other hand, the other end of the first auxiliary wire 41$a$ is connected to a transistor 202 by a metallic wire 501$b$ (a second wire). One end of a second auxiliary wire 42$a$ is connected to a transistor 102 by a metallic wire 502$a$ (a third wire). On the other hand, the other end of the second auxiliary wire 42$a$ is connected to a transistor 201 by a metallic wire 502$b$ (a fourth wire). In this way, cross wiring is formed.

Metallic wires 503 and 504 for applying gate voltages to the gate electrodes 3$a$ of the transistors are provided between the metallic wires 501$a$ and 501$b$ and arranged perpendicularly to the gate electrodes 3$a$. In this wiring structure, the metallic wires 501$b$, 502$b$, 504, 503 and 501$a$ are formed on the same layer as shown in FIG. 2B, making it unnecessary to build a second-layer wiring structure. As a result, the wiring routability is increased significantly.

Furthermore, the auxiliary wires 41$a$ and 42$a$ are formed on the same layer as the gate electrodes 3$a$ as shown in FIG. 2C, giving rise to enhanced production efficiencies.

These metallic wires 501, 502, 503 and 504 are laid out in a two-dimensional structure so that they are electrically independent of each other. Therefore, a first layer metallic wire can be used for all the wires 501, 502, 503 and 504.

Figure 10:
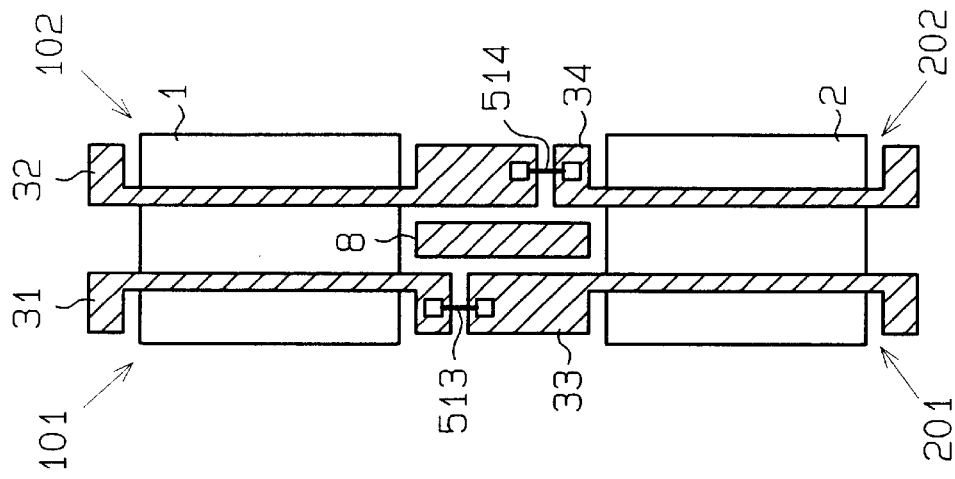
FIG. 10 is a plane diagram showing typical wiring in a macro cell of the first example.
Figure 9:
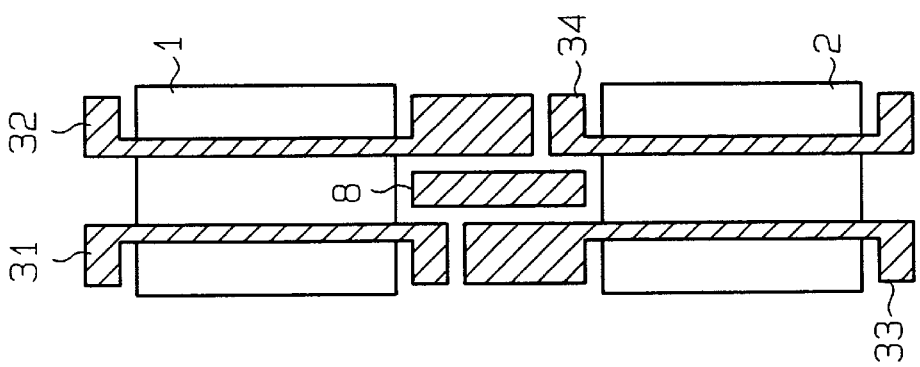
FIG. 9 is a plane diagram showing a first example of a basic cell in a conventional gate array.
Figure 11:
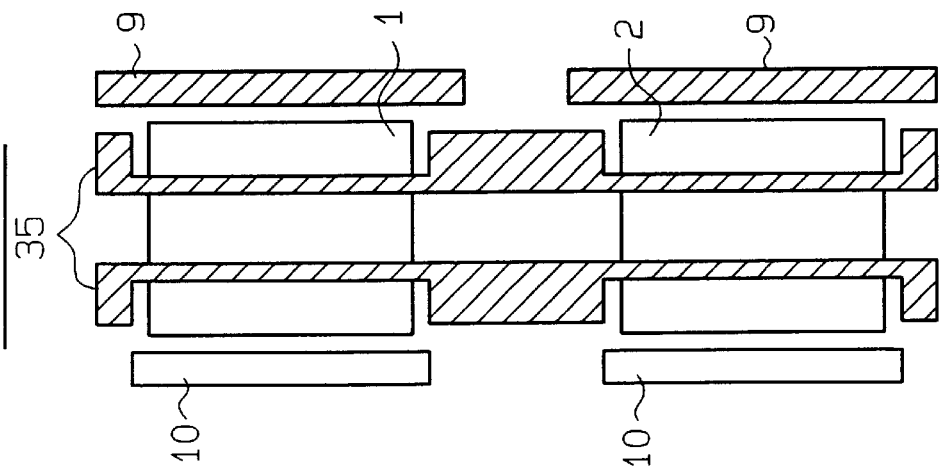
FIG. 11 is a plane diagram showing a second example of a basic cell in a conventional gate array.
Figure 12:
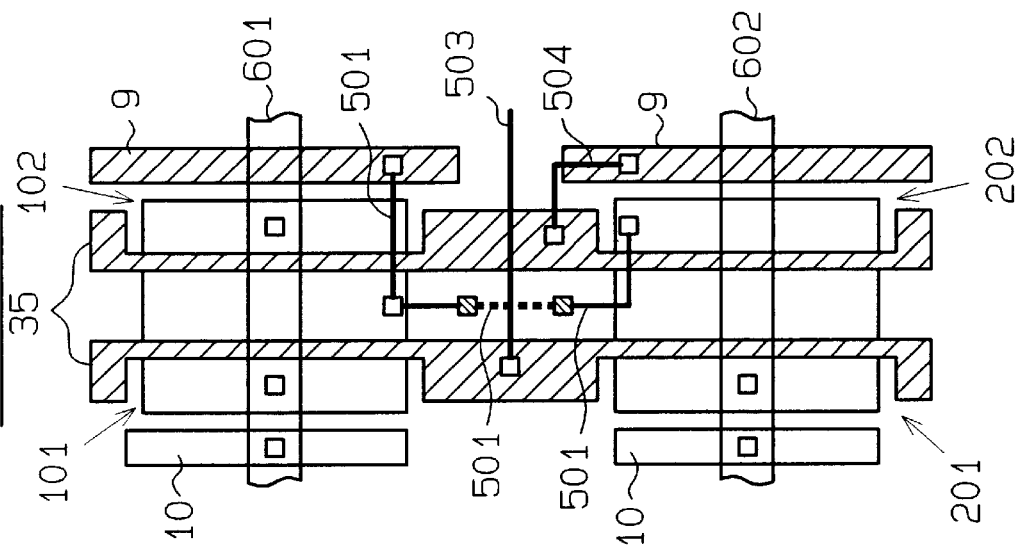
FIG. 12 is a plane diagram showing typical wiring in a macro cell of the second example.

It should be noted that, much like the structures as shown in FIGS. 10 and 12, a white square as shown in FIG. 2A represents a contact hole for connecting a diffusion layer of the pMOS 1, the nMOS 2 and the like, or a polysilicon region forming the gate electrodes 3$a$, the auxiliary wire 41$a$ or 42$a$ to a first layer metallic wire.

In this way, according to the gate array of the first embodiment, only a first-layer metallic wire is used inside a macro cell and the use of another metallic wire therein is avoided. Besides, a metallic wire other than the first-layer metallic wire can be used with a high degree of freedom between macro cells. As a result, the routability can be increased significantly.

The wiring example as shown in FIG. 2A is a so-called cross connection wherein the transistors 101, 102, 201 and 202 included in the pMOS 1 and the nMOS 2 are connected to each other by the auxiliary wires 41$a$ and 42$a$ to form the circuit as shown in FIG. 13. However, even if the transistors 101, 102, 201 and 202 are connected to each other in parallel by the auxiliary wires 41$a$ and 42$a$, there is still no need to use any additional wire besides the first layer metallic wire.

Figure 3:
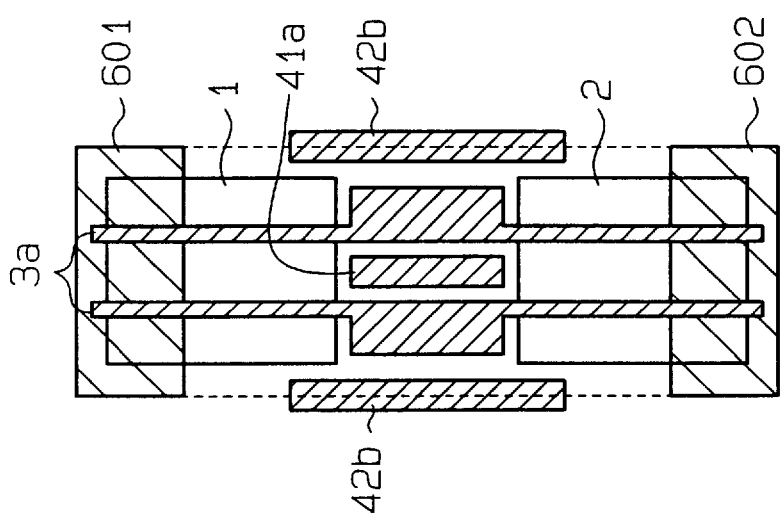
FIG. 3 is a plane diagram showing a second embodiment of a gate array according to the present invention.

FIG. 3 is a diagram showing a second embodiment of a gate array according to the present invention.

A plane structure of each basic cell in a gate array according to the second embodiment is schematically shown in FIG. 3 much like FIG. 1. In practice, thus-constructed basic cells are arranged on a substrate so that they form a one-dimensional array or a two-dimensional matrix.

The basic cell of the gate array according to the second embodiment has substantially the same structure as the first embodiment. Therefore, only a few differences in wiring structure between the embodiments will be explained below.

According to the basic cell of the gate array of the second embodiment, the length of a second auxiliary wire 42$b$ provided between adjacent basic cells is determined as follows.

The lower limit of the length of the second auxiliary wire 42$b$ is determined such that the second auxiliary wire 42$b$ can cross a metallic wire drawn out perpendicularly to the gate electrodes 3$a$ from a side of the pMOS 1 or nMOS 2 facing a side of another pMOS 1 or nMOS 2 adjacent thereto.

Figure 4:
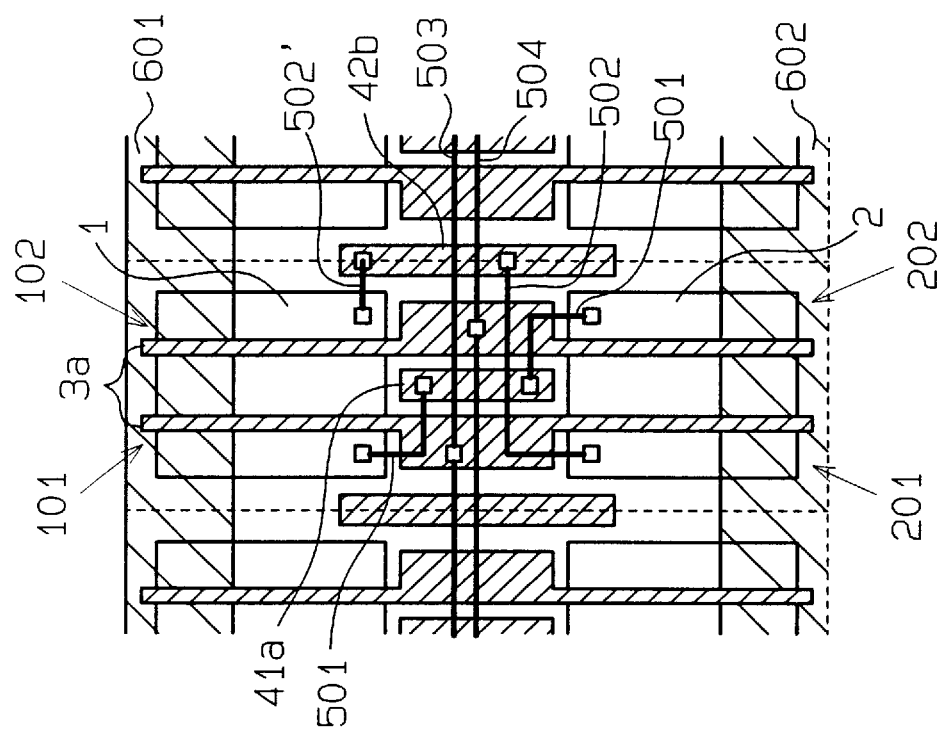
FIG. 4 is a plane diagram showing typical wiring in a macro cell according to the second embodiment.

Thus, the size of the possible wiring region between the second auxiliary wire 42$b$ and the pMOS 1 or the nMOS 2 increases. When designing a layout of the circuit as shown in FIG. 13 by using the gate array according to the second embodiment, for example, a shorter metallic wire 502' as shown in FIG. 4 will be sufficient. This advantage also holds true of parallel connection of transistors 101 and 102 included in the pMOS 1 and transistors 201 and 202 included in the nMOS 2 through the second auxiliary wires 42$b$.

At least, the degree of wiring freedom is raised and the routability is further increased by determining the lower limit of the length of the second auxiliary wire 42$b$ as described above.

On the other hand, the upper limit of the second auxiliary wire 42$b$ is determined such that the second auxiliary wire 42$b$ does not come into contact with the power supply wires 601 and 602 arranged perpendicularly to the gate electrodes 3$a$ for each basic cell as power-supply lines as shown in FIG. 3.

The parasitic capacitance and the size of the cell can be effectively prevented from increasing by determining the upper limit of the length of the second auxiliary wire 42$b$ by setting the upper limit of the length of the second auxiliary wire 42$b$ as described above.

Figure 5:
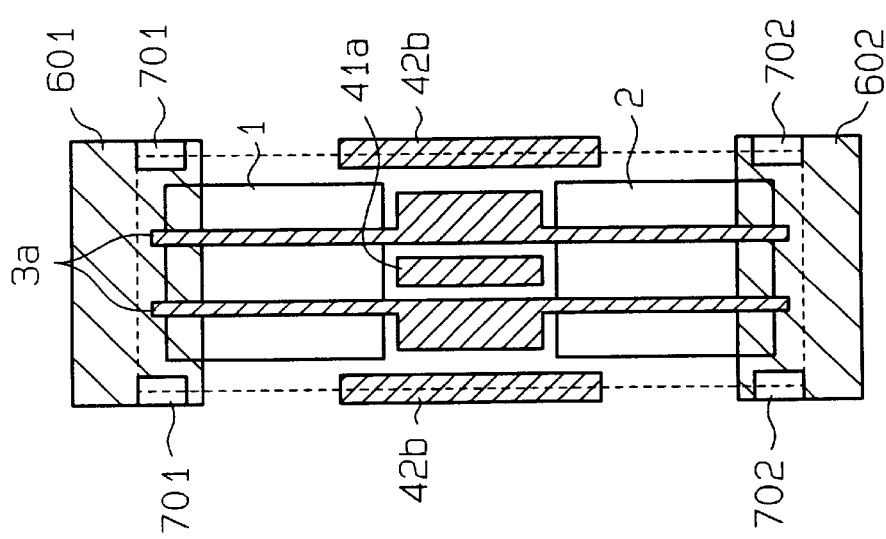
FIG. 5 is a plane diagram showing a third embodiment of a gate array according to the present invention.

FIG. 5 is a diagram showing a third embodiment of a gate array according to the present invention.

FIG. 5 schematically shows an example of a plane structure of each basic cell in a gate array according to the third embodiment of the present invention much like FIGS. 1 and 3. In practice, thus-constructed basic cells are arranged on a substrate to form a one-dimensional array or a two-dimensional matrix.

The basic cell of the gate array according to the third embodiment has substantially the same structure as the first and second embodiments. Therefore, only a few differences in wiring structure between the third and the preceding embodiments will be explained below.

With the power supply wires 601 and 602 each formed as a first layer metallic wire in the basic cell of the gate array according to the third embodiment, a bias region 701 for fixing the potential of the substrate is provided in a section of the power supply wire 601 where an extension of the second auxiliary wire 42b would cross the power supply wire 601 as is shown in FIG. 5. Likewise, a bias region 702 for fixing the potential of the substrate is provided in a section of the power supply wire 602 where an extension of the second auxiliary wire 42b would cross the power supply wire 602.

The effective size of the basic cell is determined by providing the bias regions 701 and 702 in the basic cell as described above. As a result, there is substantially no increase in cell size resulting from the use of the second auxiliary wire 42b.

Figure 6:
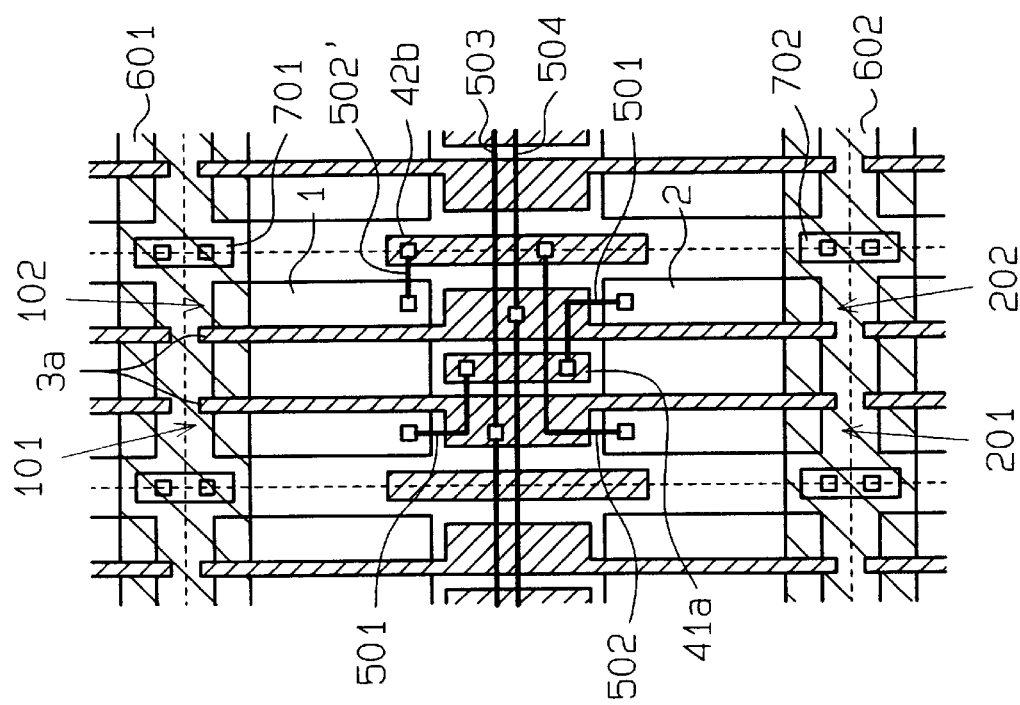
FIG. 6 is a plane diagram showing typical wiring in a macro cell according to the third embodiment.

Furthermore, in this case, even if the areas of the bias regions 701 and 702 themselves are small, a reliable supply of power is ensured from the power supply lines 601 and 602 as is obvious from the wiring structure shown in FIG. 6. That is, the basic cell structure of the gate array according to the third embodiment is also very effective in reducing the increase in cell size resulting from the use of the bias regions 701 and 702 to a minimum.

FIG. 7 is a diagram showing a fourth embodiment of a gate array according to the present invention.

FIG. 7 schematically shows a plane structure of each basic cell in a gate array according to the fourth embodiment of the present invention. In practice, thus-constructed basic cells are arranged on a substrate to form a one-dimensional array or a two-dimensional matrix.

The basic cell of the gate array according to the fourth embodiment has substantially the same structure as the first and second embodiments. Therefore, only a few differences in wiring structure between the fourth and the preceding embodiments will be described below.

When the gap between gate electrodes is small due to the condition under which the fabrication process is carried out, the aforementioned first auxiliary wire may not be provided. In such a case, an attempt to widen the gap between the gate electrodes in order to ensure a sufficient space for providing the first auxiliary wire might result in an increase in the parasitic resistance component of the drain region (or the source region) of the transistor (FET) or in the drain capacitance (or the source capacitance), which might cause the performance of the element or the device to deteriorate significantly.

In order to eliminate such drawbacks, the gate electrodes 3b in the basic cell of the gate array according to the fourth embodiment have a non-linear shape as shown in FIG. 7 wherein:

they are located close to each other in regions of the pMOS 1 and nMOS 2, and they are spaced apart from each other in a region between the pMOS 1 and nMOS 2.

A first auxiliary wire 41b is provided in the region between the pMOS 1 and nMOS 2 where the gate electrodes 3b are spaced apart from each other.

With such a basic cell structure adopted in the gate array, a conventionally unavoidable increase in the cell size due to the use of the first auxiliary wire 41b can be effectively prevented. Also, the performance of the element or the device hardly deteriorates due to an increase in parasitic resistance component and capacitance of the drain/source region of the transistors (FETs) included in the pMOS 1 and the nMOS 2.

In the gate array according to the fourth embodiment, much like the gate array according to the first and second embodiments, the following effects are observed:

(1) Wiring in the macro cell can be implemented solely by using the first layer metallic wire and metallic wires other than the first layer metallic wire can be used with a high degree of freedom between macro cells, resulting in an increased routability.

(2) The degree of wiring freedom is increased by determining the lower and upper limits of the length of the second auxiliary wire 42b, and the routability is further enhanced. At the same time, a conventionally unavoidable increase in the parasitic capacitance and the cell size due to the use of the auxiliary wire 42b can be prevented effectively.

FIG. 8 is a diagram showing a fifth embodiment of a gate array according to the present invention.

FIG. 8 schematically shows a plane structure of each basic cell in a gate array according to the fifth embodiment of the present invention. In practice, thus-constructed basic cells are arranged on a substrate to form a one-dimensional array or a two-dimensional matrix.

In addition, the basic cell structure of the gate array according to the fifth embodiment is obtained by applying the base cell structure of the gate array according to the fourth embodiment to that according to the third embodiment.

Accordingly, operation and effects of the basic cell structure of the gate array according to the fifth embodiment are substantially the same as those according to the third and fourth embodiments.

That is, the gate array according to the fifth embodiment has a basic cell structure as shown in FIG. 8 wherein:

(a) the gate electrodes 3b have a non-linear shape so that they are located close to each other in regions of a pMOS 1 and an nMOS 2 and spaced apart from each other in a region between the pMOS 1 and the nMOS 2, where a first auxiliary wire 41b is provided;

(b) power supply wires 601 and 602 are formed as a first layer metallic wire respectively, a bias region 701 is provided in a section of the power supply wire 601 where an extension of a second auxiliary wire 42b would cross the power supply wire 601 and, likewise, a bias region 702 is provided in a section of the power supply wire 602 where an extension of the second auxiliary wire 42b would cross the power-supply wire 602; and (c) the lower limit of the length of the second auxiliary wire 42b is determined such that the second auxiliary wire 42b can cross a metallic wire drawn out perpendicularly to the gate electrodes 3a from a side of the pMOS 1 or nMOS 2 facing a side of another pMOS 1 or nMOS 2 adjacent thereto, and the upper limit of the second auxiliary wire 42b is determined such that the second auxiliary wire 42b does not come into contact with the power supply wires 601 and 602.

The structure described above exhibits a number of remarkable advantages as follows:

(1) wiring inside a macro cell can be implemented solely by using first layer metallic wire and another wire other than the first-layer metallic wire can be used with a high degree of freedom between macro cells, giving rise to a substantially increased routability;

(2) the degree of wiring freedom is increased and the routability is further enhanced by determining the lower and upper limits of the length of the second auxiliary wire 42b, while a conventionally unavoidable increase in the parasitic capacitance and the cell size due to the use of the auxiliary wire 42b can be prevented effectively;

(3) there is substantially no increase in cell size caused by the use of the second auxiliary wire 42b by providing the bias regions 701 and 702 in the basic cell and the increase in cell size caused by the use of the bias regions 701 and 702 can be readily reduced to a minimum; and (4) a conventionally unavoidable increase in the cell size due to the use of the first auxiliary wire 41b can be effectively prevented and the performance of the element or the device hardly deteriorates due to an increase in parasitic resistance component and in capacitance of the drain/source region of the transistors (FETS) comprised in the pMOS 1 and the nMOS 2.

As described above, according to the first to fifth embodiments, element regions arranged parallel to and opposed to each other on the semiconductor substrate are the pMOS 1 and the nMOS 2. The conduction types of the element regions can be reversed.

Furthermore, there may be any number of transistors (FETS) included in the element regions, that is, the pMOS 1 and the nMOS 2 provided in the basic cell.

Besides, a basic cell structure that is also particularly effective in enhancing the routability is adopted in the first to fifth embodiments given a gate array with a two-layer wiring structure wherein wiring in a basic cell can be implemented solely by using the first layer metallic wire as has been hitherto described. However, the effects of the basic cell structure are not peculiar to a gate array having a two-layer wiring structure, and the basic cell structure is also effective in enhancing the routability of a gate array having three or more layers. In general, however, the fewer metallic wires provided for a gate array, the greater the reliability.

Although the present invention has been fully described in connection with the preferred embodiment thereof with reference to the accompanying drawings, it is to be noted that various changes and modifications will become apparent to those skilled in the art. Such changes and modifications are to be understood as being included within the scope of the present invention as defined by the appended claims.

What is claimed is:

1. A gate array comprising:
   a plurality of basic cells each including
      a first element region of a first conductivity type, said first element region having a plurality of transistors connected in series to each other and formed on a subtrate,
      a second element region of a second conductivity type, said second element region having a plurality of transistors connected in series to each other and formed on said substrate, said first and second element regions being arranged opposed to each other, and
      a plurality of gate electrodes commonly provided for said first and second element regions, a number of said gate electrodes corresponding to a number of said transistors; wherein
      a number of said transistors in said second element region corresponds to a number of said transistors in said first element region;
      as many gate electrodes as said transistors in said first or second element region are commonly provided for said first and second element regions; and
      said basic cells further comprise
         first auxiliary wires respectively provided between said gate electrodes between said first and second element regions, wherein said first auxiliary wires are formed on a plane of said gate electrodes and formed so that said first auxiliary wires are separated from said first and second element regions and said gate electrodes in a plane, and
         second auxiliary wires provided between said basic cells between said first and second element regions, wherein said second auxiliary wires are formed on the plane of said gate electrodes and formed so that said second auxiliary wires are separated from said first and second element regions and said gate electrodes in a plane.

2. The gate array of claim 1, further comprising:
power supply wires for supplying power to said basic cells as power supply lines arranged perpendicularly to said gate electrodes;
wherein a lower limit of a length of said second auxiliary wires is determined such that said second auxiliary wires can cross a metallic wire drawn out perpendicularly to said gate electrodes from a side of one of said first and second element regions facing a side of another first or second element region adjacent thereto; and
an upper limit of said length of said second auxiliary wires is determined such that said second auxiliary wires are prevented from contacting said power supply wires.

3. The gate array of claim 2, wherein:
said power supply lines are each provided as a first layer metallic wire; and
each of said basic cells has a bias region for fixing a potential of said substrate, said bias region being provided in a section of each of said power supply wires where figurative extensions of said auxiliary wires cross said power supply wires.

4. The gate array of claim 1, wherein:
said gate electrodes are close to each other in said first and second element regions and spaced apart from each other between said first and second element regions so that each of said gate electrodes forms a non-linear shape; and
said first auxiliary wires are provided in a section between said first and second element regions, said gate electrodes being spaced apart from each other in said section.

5. The gate array of claim 1, wherein said first and second auxiliary wires are each made of material identical to said gate electrodes and have respective thicknesses identical to said gate electrodes.

6. A gate array comprising:
a substrate; and a plurality of basic cells arranged in parallel on said substrate; wherein each of said basic cells includes
- a first element region of a first conductivity type formed on said substrate,
- a second element region of a second conductivity type formed on said substrate,
- a first gate electrode formed over a section covering said first and second element regions,
- a second gate electrode formed on said section and arranged parallel to said first gate electrode,
- first auxiliary wiring layers respectively provided between said gate electrodes between said first and second element regions, wherein said first auxiliary wiring layers are formed on a plane of said gate electrodes and formed so that said first auxiliary wiring layers are separated from said first and second element regions and said gate electrodes in a plane, and
- second auxiliary wiring layers provided between said basic cells between said first and second element regions, wherein said second auxiliary wiring layers are formed on the plane of said gate electrodes and formed so that said second auxiliary wiring layers are separated from said first and second element regions and said gate electrodes in a plane; and said basic cells are arranged so that said first gate electrodes in said basic cells are parallel to each other.

7. The gate array of claim 6, wherein said first auxiliary wiring layers are connected to one of a portion of said first element regions outside said first gate electrodes and a portion of said first element regions outside said second gate electrodes by first connecting layers, and connected to one of a portion of said second element regions outside said second gate electrodes and a portion of said second element regions outside said first gate electrodes by second connecting layers; and said second auxiliary wiring layers are connected by third connecting layers to one of portions of said first element regions outside said second gate electrodes and portions of said first element regions outside said first gate electrodes, said portions not being connected to said first auxiliary wiring layers, and connected by fourth connecting layers to one of portions of said second element regions outside said first gate electrodes and portions of said second element regions outside said second gate electrodes, said portions not being connected to said first auxiliary wiring layers.

8. The gate array of claim 7, further comprising power supply wiring layers connected to said first and second gate electrodes and arranged perpendicularly to said first and second gate electrodes between said first and second connecting layers and between said third and fourth connecting layers.

9. The gate array of claim 8, wherein said first, second, third and fourth connecting layers and said power supply wiring layers are made of identical materials and have identical thicknesses.

10. The gate array of claim 8, wherein said first, second, third and fourth connecting layers and said power supply wiring layers are formed on the same plane and said power supply wiring layers are electrically isolated from said first, second, third and fourth connecting layers.

11. The gate array of claim 7, wherein said first, second, third and fourth connecting layers are made of identical materials and have identical thicknesses.

12. The gate array of claim 7, wherein said first auxiliary wiring layers are central auxiliary wiring layers formed between said first and said second gate electrodes and said second auxiliary wiring layers are formed outside said first gate electrodes.

13. The gate array of claim 6, wherein:

said first auxiliary wiring layers are connected to portions of said first element regions outside said first gate electrodes by first connecting layers and connected to portions of said second element regions outside said second gate electrodes by second connecting layers; and said second auxiliary wiring layers are connected by third connecting layers to portions of said first element regions outside said second gate electrodes and connected by fourth connecting layers to portions of said second element regions outside said second gate electrodes.

14. The gate array of claim 6, wherein said first gate electrodes, said second gate electrodes and said auxiliary wiring layers are made of identical materials and have identical thicknesses.

15. The gate array of claim 6, wherein:

said first auxiliary wiring layers are central auxiliary wiring layers formed between said first and second gate electrodes; and said second auxiliary wiring layers are side auxiliary wiring layers formed outside said first gate electrodes.

16. The gate array of claim 1, wherein said first and second auxiliary wires are electrically separated from said first and second element regions.

17. The gate array of claim 6, wherein said first and second auxiliary wiring layers are electrically separated from said first and second element regions.

18. The gate array of claim 13, wherein said first and second auxiliary wiring layers are electrically separated from said first and second element regions.

19. The gate array of claim 16, wherein one of said first and second auxiliary wires is electrically connected to one of said first and second element regions via an additional wire.

20. The gate array of claim 17 or 18, wherein one of said first and second auxiliary wiring layers is electrically connected to one of said first and second element regions via an additional wire.

* * * * *